Jan. 9, 1968 W. C. DUNLAP, JR 3,363,056

SOLID STATE CONDUCTION CIRCUIT USED AS A TELEVISION RECEIVER DISPLAY DEVICE

Original Filed Sept. 24, 1959

INVENTOR.
WILLIAM C. DUNLAP JR.

BY

Richard T. Seeger

ATTORNEY 3,363,056
Patented Jan. 9, 1968

3,363,056

SOLID STATE CONDUCTION CIRCUIT USED AS A TELEVISION RECEIVER DISPLAY DEVICE

William C. Dunlap, Jr., Cambridge, Mass., assignor to The Bendix Corporation, Southfield, Mich., a corporation of Delaware Original application Sept. 24, 1959, Ser. No. 842,009. Divided and this application Oct. 7, 1964, Ser. No. 402,264
7 Claims. (Cl. 178—7.3)

ABSTRACT OF THE DISCLOSURE

A television receiving tube constructed of a body of high-purity semiconductor material at cryogenic temperature having a source of modulated carriers connected at one end of the body, a fluorescent coating at the opposite end of the body, accelerating grids for accelerating the modulated carriers through the body to the fluorescent coating, and horizontal and vertical deflectors to sweep the carriers.

Figure 1:
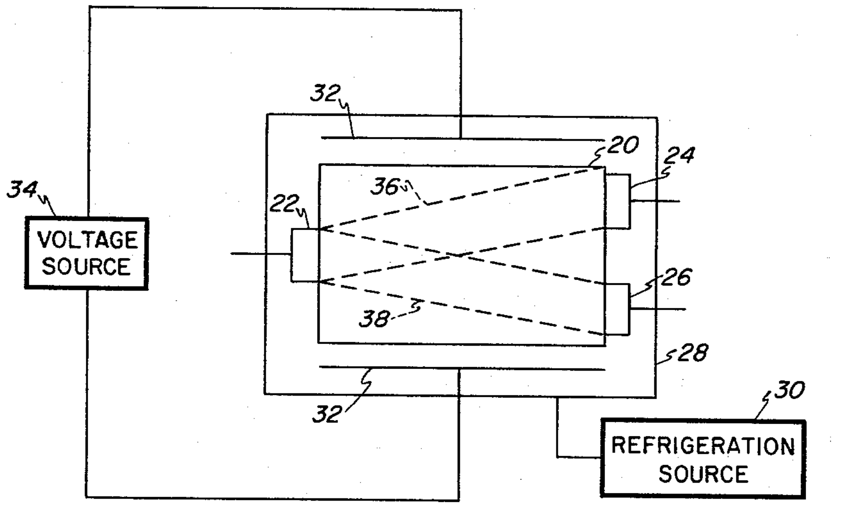

This invention pertains to a semiconductor device and more particularly to a device for providing direct carrier motion instead of drift motion. This is a division of my copending application Ser. No. 842,009, filed Sept. 24, 1959, now U.S Patent 3,176,146, entitled, Semiconductor Switch Utilizing Low Temperature and Low Impurity Content.

In prior semiconductor devices, motion of the carriers in the device was restricted to diffusion or drift wherein the carriers were constantly undergoing a change in direction due to frequent interferences with lattice vibrations and collisions with semiconductor impurities. For these reasons the mobilities and mean free path of the carriers were minute and, therefore, a beam of electrons could not be established and frequency response was limited.

This invention provides for increasing the mobilities and mean free path of carriers in semiconductor devices preferably to a length of the order of the distance between electrodes, spaced a working distance apart, so that semiconductors may be used in applications previously restricted to vacuum tubes. Increased mobility makes possible high frequency applications such as switches. In addition, since the effective mass of carriers in semiconductor materials are believed to be but a fraction of the masses in a vacuum tube, acceleration and other carrier velocity changes may be accomplished in a much shorter distance thereby decreasing component size and further increasing the maximum frequency possible in a switching mechanism.

This invention provides these advantages by reducing the semiconductor temperature sufficiently to decrease lattice vibration and by increasing the purity of the semiconductor material so that interference to carriers will be minimized. Selection of materials having normally low lattice vibration will reduce the need for the low temperature requirements.

It is, therefore, an object of this invention to provide a semiconductor device having increased carrier mobility and mean free path length.

It is another object to provide a semiconductor device wherein the temperature is reduced to reduce lattice vibrations and wherein the purity is increased to reduce interference to carrier travel.

It is another object to provide a television receiving tube comprising a body of semiconductor material at a low temperature and of increased purity with means for supplying a beam of energy entering one portion of the semiconductor body, a modulating grid for modulating the energy of the beam in proportion to the picture information received from a television camera, accelerating grids for accelerating the modulated energy source, means for deflecting the accelerated energy beam in both horizontal and vertical directions to obtain a beam sweep, a fluorescent coating on a portion of the body which is swept by the energy beam and illuminates in proportion to the instantaneous strength of the energy beam, and a light amplifier and screen for enlarging the picture on the fluorescent surface.

Figure 2:
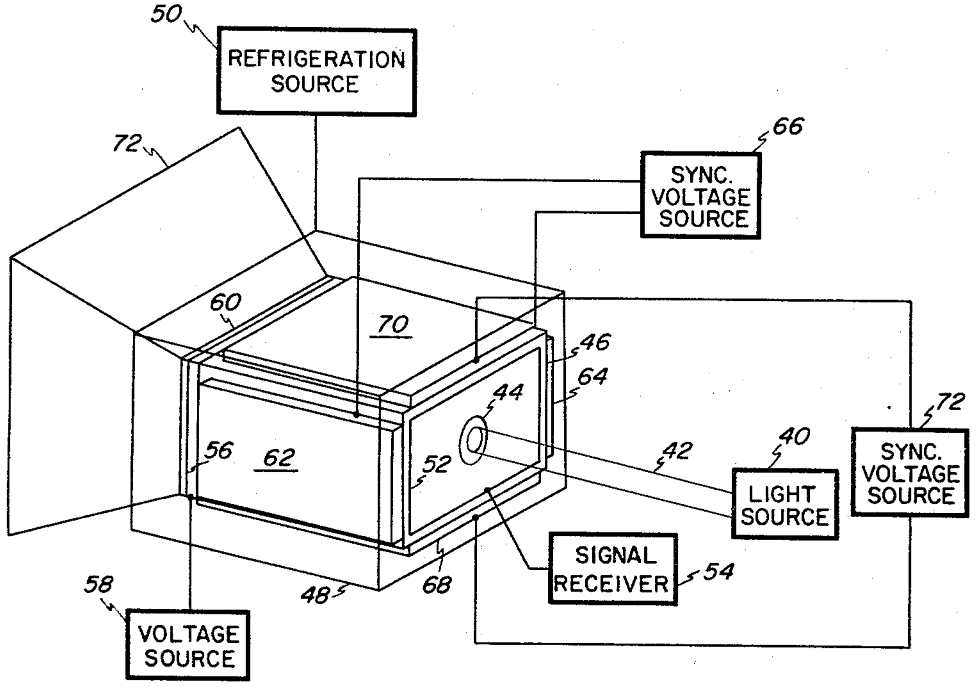

These and other objects will become more apparent when detailed descriptions of several preferred embodiments are considered in connection with the drawings, in which:

FIGURE 1 is a schematic view of a high frequency switch incorporating the semiconductor device of this invention; and FIGURE 2 is a schematic, partially perspective view of a television receiving tube incorporating a semiconductor device of this invention.

In FIGURE 1 is shown a switching device comprising a germanium wafer 20 having an input electrode 22 connected at one end thereof for receiving energy and a pair of output electrodes 24, 26. The wafer 20 is highly purified so as to reduce interference of the carriers established by the input energy from electrode 22. The purification may be in the order of $10^{10}$–$10^{12}$ impurity atoms per cubic centimeter of material. The purification required depends on the desired mean free path, the materials used and the temperature of the semiconductor.

The wafer 20 is also encased in an enclosure 28 which is connected to a refrigerator 30 for maintaining the temperature of the wafer at very low levels, such as 5° Kelvin, for germanium. At this temperature the lattice vibrations of the germanium wafer are reduced sufficiently so that energy entering at electrode 22 will form intrinsic carriers in the wafer which, owing to the lack of interference, can pass directly to either output 24 or 26. In order to control the output to which the carriers will go, an electric field is placed across the wafer. Means for doing this include a pair of deflection plates 32 which are connected to a voltage source 34. With the plates 32 at one voltage, the beam of carriers through wafer 20 will be directed to output 24 along path 36 and with the voltage on plates 32 being at another level, the carriers will be directed toward output 26 along path 38. Very high switching frequencies are obtainable with this device since the effective mass of the carriers in the germanium can be as small as $1/25$ of the masses of electrons in a vacuum tube.

A further embodiment is shown in FIGURE 2 which may be used as a television receiving tube. A source 40 emits a light beam 42 which strikes a phosphor coating 44 on the face of a germanium cube 46 which is of very high purity. Germanium cube 46 is enclosed by casing 48 the interior of which is maintained at a very low temperature such as 5° Kelvin by refrigerating means 50. A grid 52 is placed in the cube 46 adjacent the coating 44 and has a modulating voltage supplied thereto from receiver 54. Variations in the voltage of receiver 54 will control the number of intrinsic carriers generated as light beam 42 impinges on photoemissive coating 44.

Connected to the opposite face of cube 46 is an accelerating grid 56 which is supplied with a high potential from a source 58 for accelerating the electrons established in cube 46. Since the effective mass of an electron in a semiconductor material is as low as $1/25$ of the mass of an electron in a vacuum tube, the required accelerating length is correspondingly reduced. Coated on the opposite face of cube 46 is a fluorescent coating 60 which may be of phosphor or other suitable material. When the accelerated beam strikes the layer 60, a light of corresponding intensity is emitted.

Deflecting plates 62, 64 are placed on opposite sides of cube 46 and receive a high frequency, synchronized voltage from source 66 to impart a horizontal sweep to the electron beam formed by the impingement of light ray 42 on coating 44. Plate 68, 70 are placed above and below cube 46 and receive a high frequency, synchronized voltage from source 72 to impart a varying vertical field to the electron beam. The frequencies of the voltages applied to plates 62, 64 and 68, 70 are such as to provide a sweeping action of electron beam along the coating 60 often enough to present a continuous picture to the eye in the maner known to the art. The picture presented on coating 60 is amplified and projected on a screen 72 to desired dimensions by conventional means.

Although this invention has been disclosed and illustrated with reference to particular applications, the principles involved are susceptible to numerous other applications which will be apparent to persons skilled in the art. The invention is, therefore, to be limited only as indicated by the scope of the appended claims.

Having thus described my invention, I claim:

1. A solid state conduction apparatus comprising
a body of semiconductor material having inherent lattice vibrations,
means to control the temperature of said body to regulate said vibrations,
means to establish carriers in said body,
said body having a predetermined purity to minimize interference to said carriers,
means for emitting a radiation source beam,
a photoemissive coating being on said body for receiving said beam,
a first voltage controlled grid means being in a plane adjacent said coating to control particle emission from said coating,
a second voltage controlled grid means spaced from said first grid means to accelerate the emitted particles in said body,
a fluoroescent coating being on said body to receive said accelerated particles from said body.

2. A solid state conduction apparatus comprising
a body of semiconductor material having inherent lattice vibrations,
means to control the temperature of said body to regulate said vibrations,
means to establish carriers in said body,
said body having a predetermined purity to minimize interference to said carriers,
means for emitting a radiation source beam,
a photoemissive coating being on said body for receiving said beam,
a first voltage controlled grid being in a plane adjacent said coating to control particle emission from said coating into said body,
voltage controlled deflection plates being located adjacent said body to control the direction of said emitted particles in said body,
a second voltage controlled grid spaced from said first grid to accelerate the emitted particles in said body,
a fluorescent coating being on said body to receive said accelerated particles from said body,
said deflection plates including a first pair of substantially parallel plates,
and a second pair of substantially parallel plates aligned substantially perpendicular to said first pair of plates,
means to control the voltage on said plates so as to cause the accelerated radiation source beam to sweep said fluorescent surface.

3. A solid state conduction apparatus comprising
a body of semiconductor material having inherent lattice vibrations,
means to control the temperature of said body to regulate said vibrations,
means to establish carriers in said body,
said body having a predetermined purity to minimize interference to said carriers,
means for emitting a radiation source beam,
a photoemissive coating being on said body for receiving said beam,
a first voltage controlled grid being in a plane adjacent said coating to control particle emission from said coating into said body,
a second voltage controlled grid spaced from said first grid to accelerate the emitted particles in said body,
a fluorescent coating being on said body to receive said accelerated particles and thereby to form a light image,
a screen of a preselected size being aligned to receive the light image from said fluorescent coating.

4. A solid state conduction apparatus comprising
a body of semiconductor material having inherent lattice vibrations,
means to control the temperature of said body to regulate said vibrations,
means to establish carriers in said body,
said body having a predetermined purity to minimize interference to said carriers,
means for emitting a radiation source beam,
photoemissive means being adjacent said body for receiving said beam,
first means being in a plane adjacent said photoemissive means to control particle emission from said photoemissive means,
deflection means being located adjacent said body to control the direction of said emitted particles in said body,
second means spaced from said first mens to accelerate the emitted particles in said body,
fluorescent means being adjacent said body to receive said accelerated particles from said body.

5. A solid state conduction apparatus comprising
a body of semiconductor material having inherent lattice vibrations,
means to lower the temperature of said body to a temperature of 20° Kelvin or less to reduce said vibrations thereby providing a relatively free path for carrier flow through the semiconductor body,
said body having an impurity content of $10^{12}$ impurity particles per cubic centimeter or less,
means for emitting a radiaton source beam,
photoemissive means being adjacent said body for receiving said beam,
grid means being in a plane adjacent said photoemissive means to control particle emission from said photoemissive means,
deflection means being located adjacent said body to control the direction of said emitted particles in said body,
second grid means spaced from said first grid means to accelerate the emitted particles in said body,
fluorescent means being adjacent said body to receive said accelerated particles from said body.

6. A solid state conduction apparatus comprising
a body of semiconductor material having inherent lattice vibrations,
carrier source means,
means to lower the temperature of said body to a temperature of 20° Kelvin or less to reduce said vibrations thereby providing a relatively free path for carrier flow through the semiconductor body,
said body having an impurity content of $10^{12}$ impurity particles per cubic centimeter or less,
screen means locally responsive to impact of said carriers being on one surface of said body for providing an output which is indicative of point of impact of said carriers,
means to sweep said screen means with said carriers.

7. A solid state conduction apparatus comprising a body of semiconductor material having inherent lattice vibrations, means to lower the temperature of said body to a temperature of 20° Kelvin or less to reduce said vibrations thereby providing a relatively free path for carrier flow through the semiconductor body, said body having an impurity content of $10^{12}$ impurity particles per cubic centimeter or less, means for emitting a radiation source beam, a photoemissive coating being on said body for receiving said beam, a first voltage controlled grid means being in a plane adjacent said coating to control particle emission from said coating, a second voltage controlled grid means spaced from said first grid means to accelerate the emitted particles in said body, a fluorescent coating being on said body to receive said accelerated particles from said body, voltage controlled deflection plates being located adjacent said body to control the direction of said emitted particles in said body, said deflection plates including a first pair of substantially parallel plates, and a second pair of substantially parallel plates aligned substantially perpendicular to said first pair of plates, means to control the voltage on said plates so as to cause the accelerated radiation source beam to sweep said fluorescent surface.

References Cited

UNITED STATES PATENTS

| | | | |
|---|---|---|---|
| 2,944,167 | 7/1960 | Matare | 307—88.5 |
| 3,176,146 | 3/1965 | Dunlap | 307—88.5 |

JOHN W. CALDWELL, *Primary Examiner.*

J. A. ORSINO, *Assistant Examiner.*